United States Patent
Chen et al.

(10) Patent No.: US 10,964,726 B2
(45) Date of Patent: Mar. 30, 2021

(54) ARRAY SUBSTRATE, DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Wei Chen, Beijing (CN); Ling Li, Beijing (CN); Weixiong Chen, Beijing (CN); Yangheng Li, Beijing (CN); Le Zhang, Beijing (CN); Xin Li, Beijing (CN); Yong Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 16/564,320

(22) Filed: Sep. 9, 2019

(65) Prior Publication Data

US 2020/0328232 A1 Oct. 15, 2020

(30) Foreign Application Priority Data

Apr. 12, 2019 (CN) .......................... 201910295726.5

(51) Int. Cl.
*H01L 27/12* (2006.01)
*G02F 1/1362* (2006.01)
*G02F 1/1368* (2006.01)

(52) U.S. Cl.
CPC .......... *H01L 27/124* (2013.01); *G02F 1/1368* (2013.01); *G02F 1/136286* (2013.01); *G02F 2201/121* (2013.01)

(58) Field of Classification Search
CPC . H01L 27/124; G02F 1/1368; G02F 1/136286
See application file for complete search history.

(56) References Cited

U.S. PATENT DOCUMENTS

| | | | |
|---|---|---|---|
| 2017/0162599 A1* | 6/2017 | Koide | G02F 1/136286 |
| 2019/0189075 A1* | 6/2019 | Kim | G09G 3/3677 |
| 2019/0369430 A1* | 12/2019 | Obinata | G06F 3/0443 |
| 2020/0225793 A1* | 7/2020 | Huang | G02F 1/13338 |

FOREIGN PATENT DOCUMENTS

CN 107966861 A * 4/2018

* cited by examiner

*Primary Examiner* — Christine A Enad
(74) *Attorney, Agent, or Firm* — Collard & Roe, P.C.

(57) ABSTRACT

An array substrate, a display panel and a display device are provided. The array substrate includes a base substrate including a display region and a peripheral region, the peripheral region including a gate driving circuit region, a driving bonding region and a first communication region; a first common electrode line, located in the first communication region; a second common electrode line, located on a side of the gate driving circuit region away from the display region; and a third common electrode line, located in the gate driving circuit region. The second common electrode line is electrically connected to the first common electrode line, the third common electrode line includes a first end close to the driving bonding region and a second end close to the first communication region, the second end of the third common electrode line is insulated from the first common electrode line.

20 Claims, 5 Drawing Sheets

ARRAY SUBSTRATE, DISPLAY PANEL AND DISPLAY DEVICE

The present application claims priority to Chinese patent application No. 201910295726.5, filed on Apr. 12, 2019, the entire disclosure of which is incorporated herein by reference as part of the present application.

TECHNICAL FIELD

The present disclosure relates to an array substrate, a display panel and a display device.

BACKGROUND

At present, display panels have been more and more widely used in the market. For example, thin film transistor liquid crystal display (TFT-LCD), organic light emitting diode display (OLED), etc., have been widely used in terminal devices such as televisions, laptops, and mobile phones. With the rise of narrow-frame terminals and the advantages of low cost of twisted nematic (TN) type TFT-LCDs, etc., narrow-frame TN-type TFT-LCDs have gained more development.

SUMMARY

The Embodiments of the present disclosure provide an array substrate, including a base substrate, the base substrate including a display region and a peripheral region surrounding the display region, the peripheral region including a gate driving circuit region, a driving bonding region and a first communication region, the driving bonding region and the first communication region are respectively disposed on both sides of the display region in a first direction parallel to the base substrate, the gate driving circuit region is disposed on at least one side of the display region in a second direction parallel to the base substrate, the first direction and the second direction intersecting with each other; a first common electrode line, located in the first communication region; a second common electrode line, located on a side of the gate driving circuit region away from the display region; and a third common electrode line, located in the gate driving circuit region; wherein the second common electrode line is electrically connected to the first common electrode line, and is electrically connected to a driving element in the driving bonding region; the third common electrode line includes a first end close to the driving bonding region and a second end close to the first communication region, the first end of the third common electrode line is connected to the driving element, the second end of the third common electrode line is insulated from the first common electrode line.

In some examples, the second end of the third common electrode line and the first common electrode line are spaced apart from each other.

In some examples, the first communication region is configured to electrically connect the first common electrode line with an external device.

In some examples, the driving element is configured to load a common electrode signal of a preset duration to the third common electrode line before outputting a display driving signal; the driving element is further configured to drive the array substrate to display upon a startup time of the array substrate reaching the preset duration.

In some examples, an insulating layer is located on a side of the third common electrode line away from the base substrate, and a first via hole communicated with the third common electrode line is located in the insulating layer; wherein a distance from an orthographic projection of the first via hole on the third common electrode line to the first end of the third common electrode line is greater than a distance from the orthographic projection of the first via hole on the third common electrode line to the second end of the third common electrode line.

In some examples, the orthographic projection of the first via hole on the third common electrode line at least partially overlaps with the second end of the third common electrode line.

In some examples, a conductive member is located in the first via hole, and the conductive member is configured to electrically connect the third common electrode line with an external device.

In some examples, the insulating layer is further located on a side of the first common electrode line away from the base substrate, and the insulating layer has a thickness of not less than 4000 Å.

In some examples, a width of the third common electrode line is greater than a width of the second common electrode line.

In some examples, the second common electrode line and the third common electrode line extend in the first direction, and the first common electrode line extends in the second direction.

The embodiment of the present disclosure provides a display panel, including any one array substrate described above.

In some examples, the display panel further includes: an opposite substrate cell-assembled with the array substrate, wherein the opposite substrate includes a second communication region, an orthographic projection of the second communication region on the base substrate of the array substrate at least partially overlaps with an orthographic projection of the first communication region on the base substrate of the array substrate; the opposite substrate further includes an opposite substrate common electrode, and a portion of the opposite substrate common electrode is located in the second communication region, and is electrically connected to the first common electrode line of the first communication region.

In some examples, a first insulating layer is located on a side of the third common electrode line away from the base substrate, and a first via hole communicated with the third common electrode line is located in the first insulating layer; an orthographic projection of the first via hole on the third common electrode line at least partially overlaps with the second end of the third common electrode line, or a distance from the orthographic projection of the first via hole on the third common electrode line to the first end of the third common electrode line is greater than a distance from the orthographic projection of the first via hole on the third common electrode line to the second end of the third common electrode line; a conductive member electrically connected to the opposite substrate common electrode is located between the opposite substrate common electrode and the array substrate, and the conductive member is electrically connected to the third common electrode through the first via hole.

In some examples, an outer side of the conductive member is wrapped with a second insulating layer.

In some examples, a conductive sealant is located between the first communication region of the array substrate and the second communication region of the opposite substrate, and the sealant is configured to electrically connect the first common electrode line with the opposite substrate common electrode.

In some examples, the first insulating layer is further located on a side of the first common electrode line away from the base substrate, a plurality of second via holes communicated with the first common electrode line are located in the first insulating layer, a connecting electrode is located on a side of the first insulating layer away from the base substrate; wherein an area of an orthographic projection of a region where the connecting electrode directly contacts the sealant on the base substrate is a first area, and an area of an orthographic projection of the connecting electrode on the base substrate is a second area, a ratio of the first area to the second area is greater than 30%.

In some examples, the first insulating layer has a thickness of no less than 4000 Å.

In some examples, an outer edge of the opposite substrate common electrode is located at an inner side of an outer edge of the opposite substrate, and is separated from the outer edge of the opposite substrate.

In some examples, an insulating sealant is located between the array substrate and the opposite substrate and in a region between the outer edge of the opposite substrate common electrode and the outer edge of the opposite substrate, the insulating sealant is disposed at an outer side of the conductive sealant.

The embodiment of the present disclosure provides a display device, including any one display panel described above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In a display panel of a narrow-frame TN type TFT-LCD, a side close to a source driver is a data pad (DP) side of the panel, and a side opposite to the DP side is a DPO side. The DPO side is prone to generate strong static electricity, resulting in that the signal of the driving circuit is unable to control the active area (a pixel area where the pixel array is located), thereby leading to display errors. In addition, in a narrow-frame display panel of the related art, an end adjacent to the DPO side of the display panel, of a common electrode line located in the gate driving circuit region of the array substrate, is directly connected to a common electrode line in a communication region (a region where the array substrate communicates with the opposite substrate) located on the DPO side of the array substrate. Because the common electrode line in the gate driving circuit region is relatively wide, most of the electrostatic current on the DPO side enters the gate driving circuit region through the common electrode line in the gate driving circuit region. The gate driving circuit region is provided with a via hole connected to other component or signal line, and the above electrostatic current flowing into the gate driving circuit region may cause the heating and burning of the via hole in the gate driving circuit region.

Figure 1:
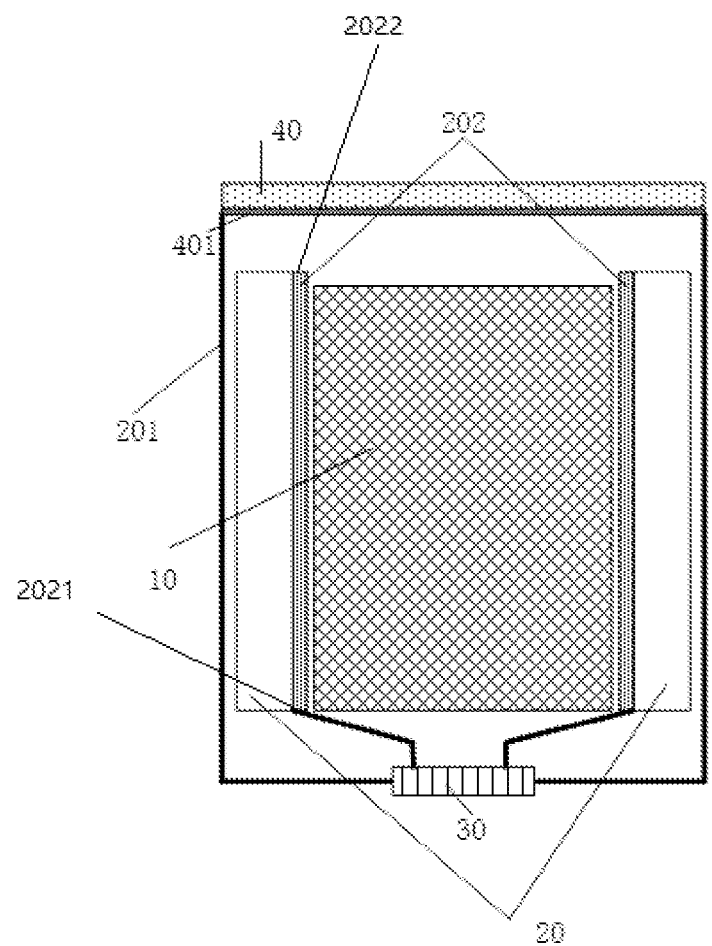
FIG. 1 is a schematic structural diagram of an array substrate according to an embodiment of the present disclosure.

The embodiment of the present disclosure provides an array substrate. Referring to FIG. 1, a schematic planar structural diagram of an array substrate according to an embodiment of the present disclosure is shown. The array substrate includes a base substrate 50 (please referring to FIG. 4 or FIG. 5), and a display region 10, a gate driving circuit region 20, a driving bonding region 30 and a first communication region 40 disposed on the base substrate 50, the driving bonding region 30 being located on a side of the display region 10, the first communication region 40 being located on a side of the display region 10 away from the driving bonding region 30. A first common electrode line 401 is disposed in the first communication region 40 (for example, on a side of the first communication region 40 close to the display region), a second common electrode line 201 is disposed on a side of the gate driving circuit region 20 away from the display region 10, and a third common electrode line 202 is disposed on a side of the gate driving circuit region 20 close to the display region 10. The second common electrode line 201 is electrically connected to the first common electrode line 401 and a driving element in the driving bonding region 30, respectively; the third common electrode line 202 includes a first end 2021 close to the driving bonding region 30 and a second end 2022 close to the first communication region 40, the first end 2021 of the third common electrode line 202 is connected to the driving element, and the second end 2022 of the third common electrode line 202 is insulated from the first common electrode line 201.

For example, as can be seen from FIG. 1, the base substrate can include the display region 10. The display region here is not a specific component, but a division of each region of the base substrate in a planar direction. For example, a display element or the like can be disposed on the display region 10 of the base substrate for display. For example, a part surrounding the display region 10 is a peripheral region. For example, the peripheral region can include the gate driving circuit region 20, the driving bonding region 30, and the first communication region 40. In a first direction X parallel to the base substrate, the driving bonding region 30 and the first communication region 40 are respectively disposed on both sides of the display region 10; in a second direction Y parallel to the base substrate, the gate driving circuit region 20 is disposed on at least one side of the display region. In the example shown in FIG. 1, the gate driving circuit region 20 is disposed on both sides of the display region 10.

For example, as shown in FIG. 1, the first direction X can be perpendicular to the second direction Y.

For example, as shown in FIG. 1, that the second end 2022 of the third common electrode line 202 is insulated from the first common electrode line 201 can be implemented by the following means: the second end 2022 of the third common electrode 202 and the first common electrode line 201 are spaced apart from each other. That is, the second end 2022 and the first common electrode line 201 are not physically connected or contacted, but are separated by a certain distance.

For example, the first end and the second end of the third common electrode line 202 here are part of the ends of the third common electrode line.

For example, the first communication region 40 described above is configured to electrically connect the first common electrode line with an external device, so as to transmit a common voltage on the first common electrode line to the external device. For example, the external device here can be an opposite substrate cell-assembled with the array substrate, which will be described in detail later.

For example, the second common electrode line and the third common electrode line extend in the first direction X, and the first common electrode line extends in the second direction Y.

In the embodiment of the present disclosure, the display region 10 may also be referred to as an active area (AA, that is, a pixel area where the pixel array is located). When the array substrate is in operation, the display region 10 can display under the control of the gate driving circuit region 20; the gate driving circuit region 20 can transmit a control signal to control the display of the display region 10 according to the driving of the driving element in the driving bonding region 30.

For example, a side of the array substrate close to the driving bonding region 30 is a DP side of the panel, and a side opposite to the DP side is a DPO side. A first common electrode line 401 is disposed in the first communication region 40 at the DPO side of the array substrate, and the first common electrode line 401 is configured to communicate with an opposite substrate common electrode of the opposite substrate (not shown in FIG. 1, please referring to FIGS. 4-6), thereby ensuring that the potential of the first common electrode line 401 is equal to the potential of the opposite substrate common electrode in the opposite substrate. The second common electrode line 201 is configured to transmit a common electrode signal to the first common electrode line 401, and the third common electrode line 202 is configured to transmit a common electrode signal to the gate driving circuit in the gate driving circuit region 20.

For example, for the array substrate on which one end of the third common electrode line close to the DPO side is connected to the first common electrode line, a communication portion of one end of the third common electrode line 202 close to the first communication region 40 and the first common electrode line 401 can be cut by means of laser cutting or the like, so that one end of the third common electrode line 202 close to the first communication region 40 is insulated from the first common electrode line 401, and thus, the array substrate of the embodiment of the present disclosure can be compatible with the existing array substrate. In experiments, the embodiment of the present disclosure performs a plurality of tests on the array substrate cut by means of laser cutting mentioned above, and no phenomenon of electrostatic breakdown of the via hole in the gate driving circuit region occurs. It can be understood that, when the array substrate of the embodiment of the present disclosure is manufactured, the one end of the third common electrode line 202 close to the first communication region 40 in the array substrate can be directly formed to be spaced apart from the first common electrode line 401. For example, the insulation can be achieved by setting a spacing distance or setting an insulator, etc., between them, which is not specifically limited in the embodiment of the present disclosure.

In the embodiment of the present disclosure, the third common electrode line 202 in the gate driving circuit region 20 is insulated from the first common electrode line 401 in the first communication region, that is, the common electrode line entering the gate driving circuit region 20 from the first communication region 40 in the array substrate is cut, so that static electricity does not directly flow to the gate driving circuit region 20 in a large amount, the phenomenon of breakdown of the via hole in the gate driving circuit region 20 due to the electrostatic releasing is avoided, and the antistatic releasing property of the array substrate is improved. Although the common electrode line entering the gate driving circuit region 20 from the first communication region 40 in the array substrate is cut, the first communication region 40 can still communicate with the third common electrode line via the driving bonding region. For example, as shown in FIG. 1, the first common electrode line 401 can be electrically connected to the third common electrode line 202 through the second common electrode line 201 and the driving element in the driving bonding region 30 in sequence, so the embodiment of the present disclosure do not damage the basic performance of the array substrate on the basis of improving the antistatic releasing property of the array substrate.

In the embodiment of the present disclosure, when the arrangement manner in which the second end 2022 of the third common electrode line 202 in the gate driving circuit region is insulated from the first common electrode line 401 in the first communication region 40 is applied to a display device having a small area, because the electrode lines in the small display device are short and the electrical conduction velocity is fast, the electrical conduction time delay in the array substrate has substantially no influence on the display control, and the display control will not be delayed. However, when the arrangement manner in which the second end 2022 of the third common electrode line 202 in the gate driving circuit region is insulated from the first common electrode line 401 in the first communication region 40 is applied to a display device having a large area, the electrical conduction delay will be obvious in the common electrode line. Referring to FIG. 1, the first common electrode line 401 is insulated from the second end of the third common electrode line 202 (that is, the first common electrode line 401 and the second end of the third common electrode line 202 are spaced apart from each other and are not connected with each other), so that the common electrode signal of the first common electrode line 401 cannot be directly transmitted to the third common electrode line 202, and one end of the third common electrode line 202 close to the first common electrode line 401 needs to wait for the common electrode signal of the driving bonding region 30 at the DP side to transmit along a direction from the DP side to the DPO side. There may be a time delay in the process of the transmission, so that the end of the third common electrode line 202 close to the first common electrode line 401 (for example, it may correspond to an end of the gate driving circuit region for controlling the display of the first row of pixels) receives the common electrode signal with delay, thereby causing phenomena such as control logic error, etc., and causing the display color to be abnormal.

As an implementation of the embodiment of the present disclosure, in order to adapt to a display device having a large area, the driving element is configured to determine a preset output duration of the common electrode signal according to the electrical conduction velocity of the third common electrode line 202 along the direction from the DP side to the DPO side (i.e., the first direction); and the driving element is further configured to perform a display driving upon a startup time of the array substrate reaching the preset output duration.

For example, the electrical conduction velocity of the third common electrode line 202 can be determined comprehensively according to the specific material, length, and the like of the third common electrode line, and is not specifically limited in the embodiment of the present disclosure. After the preset output duration is determined, display driving can be performed when the startup time of the array substrate reaches the preset output duration. After the startup time of the array substrate reaches the preset output duration, it can be ensured that the common electrode signal has been transmitted to the end of the third common electrode line 202 close to the DPO. And it can be considered that the whole array substrate is charged, and then display driving is performed, so that there is no abnormal display problem due to electrical conduction delay during the display driving, and thus, the array substrate of the embodiment of the present disclosure can be applied to a display device having a large area. For example, a width of the third common electrode line is greater than a width of the first common electrode line, and is greater than a width of the second common electrode line. For example, the "width" here refers to a dimension of an electrode line in a direction perpendicular to an extending direction thereof in a plane parallel to the base substrate.

As another implementation of the embodiment of the present disclosure, in order to adapt to a display device having a large area, it can also be configured that the end of the third common electrode line close to the first communication region is covered by a first insulating layer, and a first via hole communicated with the third common electrode line is formed in the first insulating layer.

Figure 2:
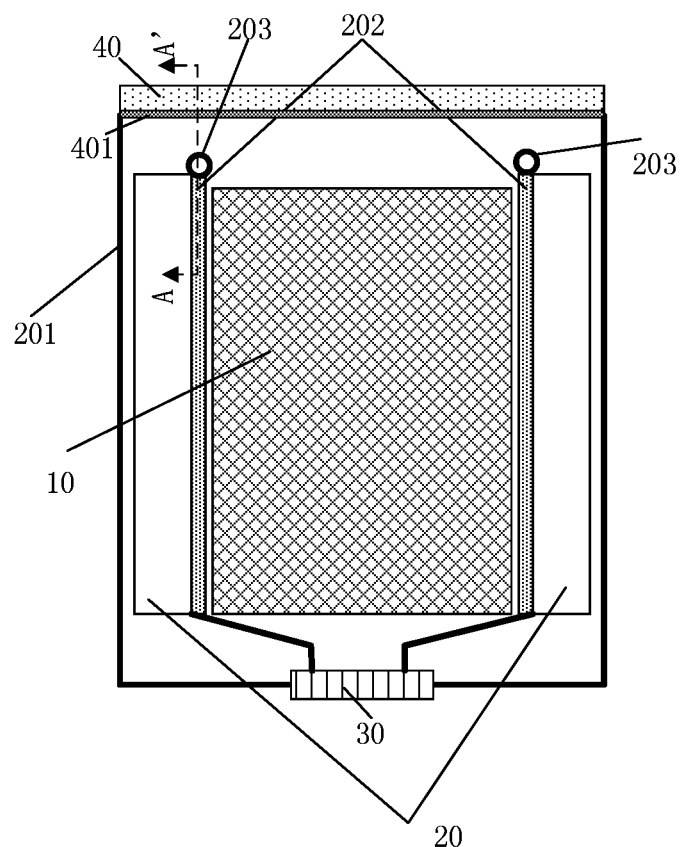
FIG. 2 is a schematic structural diagram of an array substrate according to another embodiment of the present disclosure.
Figure 4:
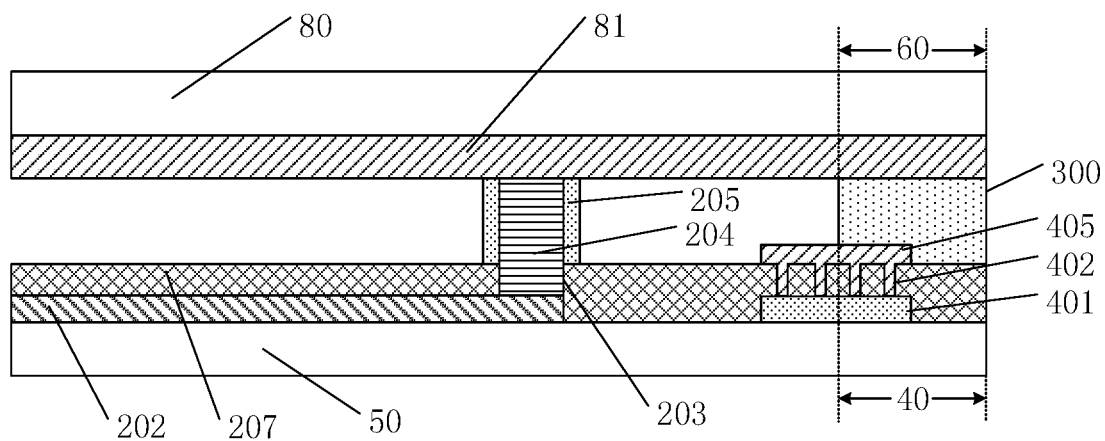
FIG. 4 is a schematic diagram of a display panel according to an embodiment of the present disclosure.
Figure 5:
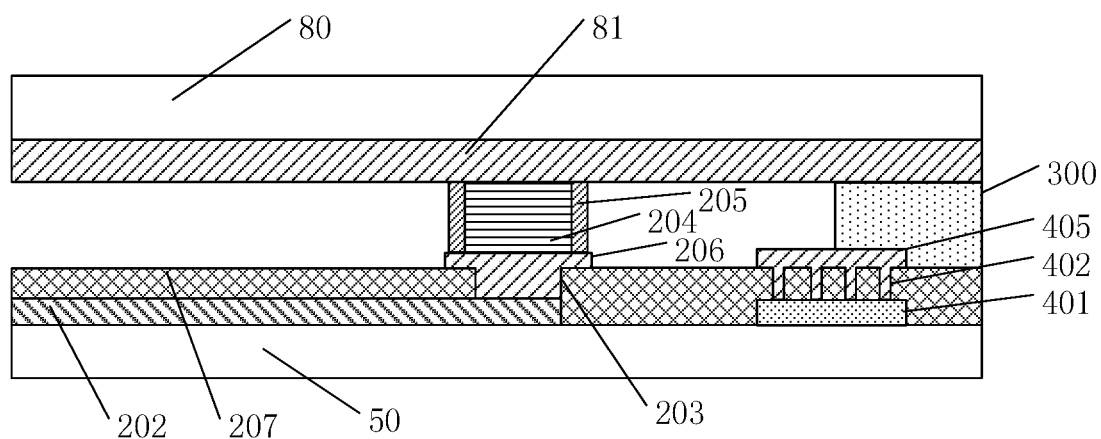
FIG. 5 is a schematic diagram of a display panel according to another embodiment of the present disclosure.

FIG. 2 is a schematic planar structural diagram of an array substrate according to an embodiment of the present disclosure. FIGS. 4-5 are cross-sectional views taken along line AA' in FIG. 2. However, in order to describe the structure of the array substrate of the embodiment of the present disclosure and its connection relationship with the opposite substrate more clearly, FIGS. 4-5 show not only the array substrate, but also the opposite substrate cell-assembled with the array substrate. Therefore, FIG. 4 and FIG. 5 can also be regarded as cross-sectional views of a display panel including an array substrate and an opposite substrate. For example, as shown in FIGS. 4-5, the first insulating layer 207 covers the third common electrode line 202, and the first via hole 203 is formed therein. The first via 203 is located at one end of the third common electrode line close to the first communication region 40. For example, a conductive member can be used to communicate the third common electrode line 202 with the opposite substrate common electrode of the opposite substrate through the first via hole 203, so as to directly transmit a common electrode signal to the end of the third common electrode line 202 close to the first communication region 40 through the opposite substrate common electrode of the opposite substrate. With this configuration, the common electrode signal does not need to be transmitted from the driving element to the end of the third common electrode line 202 close to the first communication region 40 along the direction from the DP side to the DPO side, thereby avoiding the occurrence of the delay phenomenon when the common electrode signal is transmitted to the end of the third common electrode line 202 close to the first communication region 40, and thus, the array substrate of the embodiment of the present disclosure can be applied to a display device having a large area.

For example, a cross-sectional area of the first via hole 203 can be set slightly larger, so that the first via hole can accommodate a large-sized conductive member, thereby increasing the technical margin of the conductive member disposed in the first via hole. The specific size of the first via hole can be set by those skilled in the art according to an actual application scenario. For example, the aperture of the first via hole 203 can be 10-15 microns.

For example, the opposite substrate includes a base substrate 80 and an opposite substrate common electrode 81 on a side of the base substrate 80 facing the array substrate. As can be seen from FIG. 4 and FIG. 5, the third common electrode 202 is covered by the first insulating layer 207, and the first via hole 203 is disposed at an end of the third common electrode line 202 close to the first communication region. As shown in FIG. 4, the conductive member can be a conductive pillar 204, and the conductive pillar 204 can be disposed on the array substrate. After the conductive pillar 204 on the array substrate passes through the first via hole 203, the conductive pillar 204 can be electrically connected with the opposite substrate common electrode 82 of the opposite substrate. For example, a second insulating layer 205 is disposed at an outer side of a portion of the conductive pillar 204 that protrudes from the first via hole 203. In some other examples, referring to FIG. 5, the conductive pillar 204 can also be disposed on the opposite substrate, a fifth common electrode 206 is disposed in the first via hole 203 of the array substrate, the conductive pillar 204 on the opposite substrate can be electrically connected with the third common electrode line 202 of the array substrate via the fifth common electrode 206, and a third insulating layer 205 is disposed at an outer side of the conductive pillar 204.

As shown in FIG. 2, the first via hole is disposed at the second end of the third common electrode line, but the embodiment of the present disclosure is not limited thereto, for example, the first via hole can also be disposed between the first end and the second end of the third common electrode line, and a distance from the first via hole to the first end is greater than a distance from the first via hole to the second end. For example, a distance from an orthographic projection of the first via hole on the third common electrode line to the first end of the third common electrode line is greater than a distance from the orthographic projection of the first via hole on the third common electrode line to the second end of the third common electrode line; or, the orthographic projection of the first via hole on the third common electrode line at least partially overlaps with the second end of the third common electrode line; or, the orthographic projection of the first via hole on the third common electrode line overlaps with the second end of the third common electrode line.

It should be noted that only some of the layers or components of the array substrate are exemplarily shown in FIGS. 4-5, and it is not to be construed that the array substrate includes only the layers or components shown in the drawings. For example, other layers or components may be included between the third common electrode line 202 and the base substrate 50 shown in FIGS. 4-5, and it is not limited to that the third common electrode line 202 is in direct contact with the base substrate 50. In addition, a connection structure of the first common electrode line and the opposite substrate common electrode is also shown in FIG. 4 and FIG. 5, which will be described in more detail below with reference to FIG. 3.

As another implementation of the embodiment of the present disclosure, an insulating layer is disposed on a side of the first common electrode line away from the substrate, and the insulating layer has a thickness greater than or equal to 4000 Å. For example, as shown in FIG. 4 and FIG. 5, the insulating layer disposed on a side of the first common electrode line away from the base substrate can be the same insulating layer as the first insulating layer 207 covering the third common electrode line 202. In the following description, they will be collectively referred to as the first insulating layer. By increasing the thickness of the first insulating layer, the breakdown of the via hole in the first communication region by the static electricity of the first communication region and the circuit damage resulted therefrom can be avoided. It is found in experiments that when the thickness of the first insulating layer obtained by using the plasma-enhanced chemical vapor deposition (PECVD) method is increased to more than 4000 Å, the electrostatic releasing test indicates an obvious improved performance During the electrostatic releasing test, the static electricity carried by the Au ball (conductive gold ball) above the first electrode connection line does not break through the first insulating layer, thus ensuring that the common electrode wiring is unblocked. Moreover, because the TFT (array) substrate surface of the TN type panel has only one layer of conductive electrode, even if the thickness of the first insulating layer changes, there is no other influence on the array substrate.

It is also found in experiments that in a narrow-frame display product, the electrical connection of the first communication region of the array substrate and the second communication region of the opposite substrate is usually realized by means of dispensing (including Au balls) or linear coating (including Au balls) at the DPO side of the array substrate and the DPO side of the opposite substrate. However, the area of a connecting electrode covering the via hole in the first communication region of the array substrate in the related art is generally small, so that the effective communication area is small when the first communication region of the array substrate is electrically connected to the second communication region of the opposite substrate, thereby resulting in an adverse phenomenon that the opposite substrate common electrode of the opposite substrate is insufficiently charged and a whitish display occurs, and this phenomenon is particularly obvious in an implementation manner of dispensing.

As shown in FIG. 4 and FIG. 5, in the first communication region, a plurality of second via holes 402 communicated with the first common electrode line 401 are disposed in the first insulating layer 207, a connecting electrode 405 is disposed on a side of the insulating layer away from the base substrate.

Figure 3:
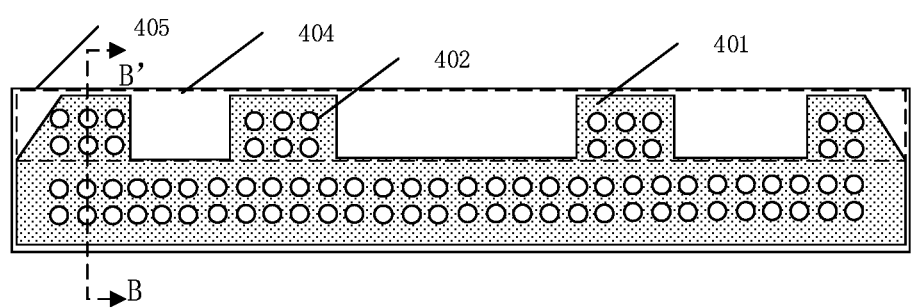
FIG. 3 is a schematic diagram of a first communication region according to an embodiment of the present disclosure.

FIG. 3 is a partial plan view of a vicinity of a first communication region of the array substrate. For clarity of illustration, FIG. 3 shows only the first common electrode line 401, the connecting electrode 405, and the second via hole 402 located between the first common electrode 401 and the connecting electrode 405 and connecting them. FIG. 4 and FIG. 5 are cross-sectional views taken along line BB' in FIG. 3. It should be noted that the position of the line BB' in FIG. 3 and the position of the line AA' in FIG. 2 correspond to each other. As can be seen from FIG. 4 and FIG. 5, the first common electrode line 401 is connected to the connecting electrode 405 through the second via hole 402 in the first insulating layer 207. Further, the connecting electrode 405 is connected to the opposite substrate common electrode 81 on the opposite substrate via a sealant 300.

As shown in FIG. 3, the connecting electrode 405 in the first communication region 40 of the array substrate according to the embodiment of the present disclosure can substantially completely cover the first common electrode line 401. FIG. 3 exemplarily shows that the first common electrode line 401 in a form of having a plurality of protruding structures at one side thereof (for example, the upper side in FIG. 3). However, the embodiment of the present disclosure is not limited thereto. For example, one side at which the first common electrode line 401 having the protruding structures is a side close to the DPO side of the display panel. For example, a region where the connecting electrode 405 is in direct contact with the sealant 300 can be a region circled by a dashed box 404 in FIG. 3. It is found in experiments that, an area of an orthographic projection of the region 404 where the connecting electrode 405 directly contacts the sealant 300 on the base substrate 50 is a first area, and an area of an orthographic projection of the connecting electrode 405 on the base substrate 50 is a second area; in a case where a ratio of the first area to the second area is greater than 30%, the charging efficiency of the opposite substrate common electrode of the opposite substrate can be effectively improved to reduce the occurrence of whitish display, and at the same time, the contacting area of the connecting electrode and the sealant is increased, thereby being conducive to the dispersion of static electricity.

In order to further improve the charging efficiency of the opposite substrate common electrode of the opposite substrate, an orthographic area of the orthographic projection of the plurality of second via holes on the base substrate falling within the orthographic projection of the contacting portion of the connecting electrode and the sealant is a third area, an area of the orthographic projection of the plurality of second via holes on the base substrate is a fourth area, and a ratio of the third area to the fourth area is greater than 30%

In summary, in the embodiment of the present disclosure, the first common electrode line located in the first communication region of the array substrate is connected to the driving element of the driving bonding region through the second common electrode line, one end of the third common electrode line in the gate driving circuit region is connected to the driving element, and the other end of the third common electrode line is close to the first communication region and insulated from the first common electrode line. Because the second end of the third common electrode line in the gate driving circuit region is insulated from the first common electrode line in the first communication region, that is, the common electrode line entering the gate driving circuit region from the first communication region in the array substrate is cut, so that static electricity does not directly flow to the gate driving circuit region in a large amount, the phenomenon of breakdown of the via hole in the gate driving circuit region due to the electrostatic releasing is avoided, and the antistatic releasing property of the array substrate is improved. Although the common electrode line entering the gate driving circuit region from the first communication region in the array substrate is cut, the first communication region can still communicate with the third common electrode line via the driving bonding region, so the embodiment of the present disclosure do not damage the basic performance of the array substrate on the basis of improving the antistatic releasing property of the array substrate.

The embodiment of the present disclosure provides a display panel including the array substrate described above.

Figure 6:
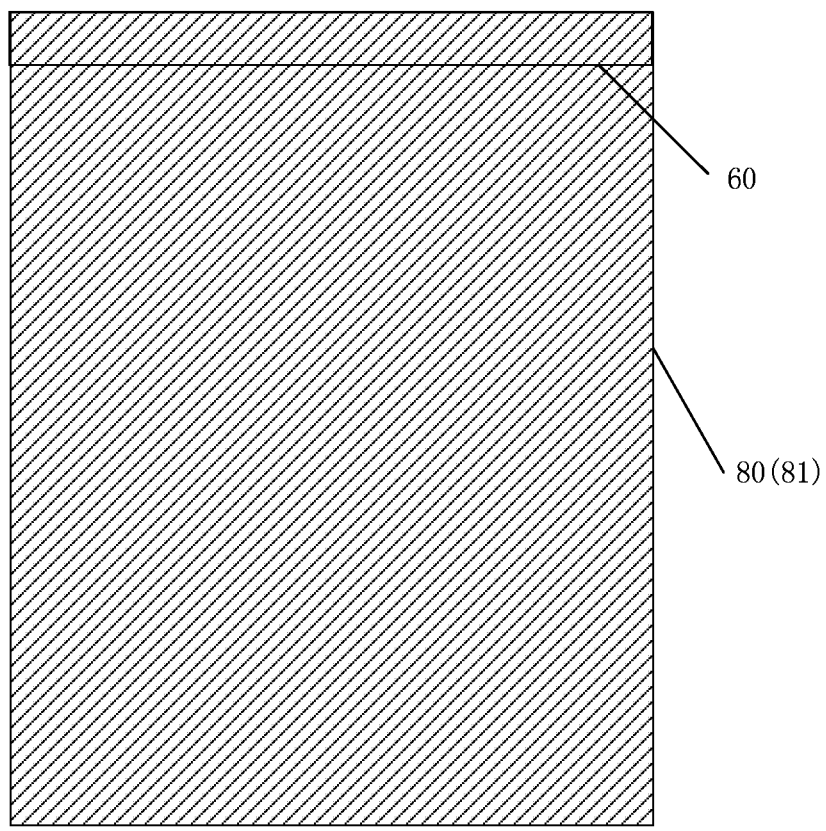
FIG. 6 is a schematic structural diagram of an opposite substrate according to an embodiment of the present disclosure.
Figure 7:
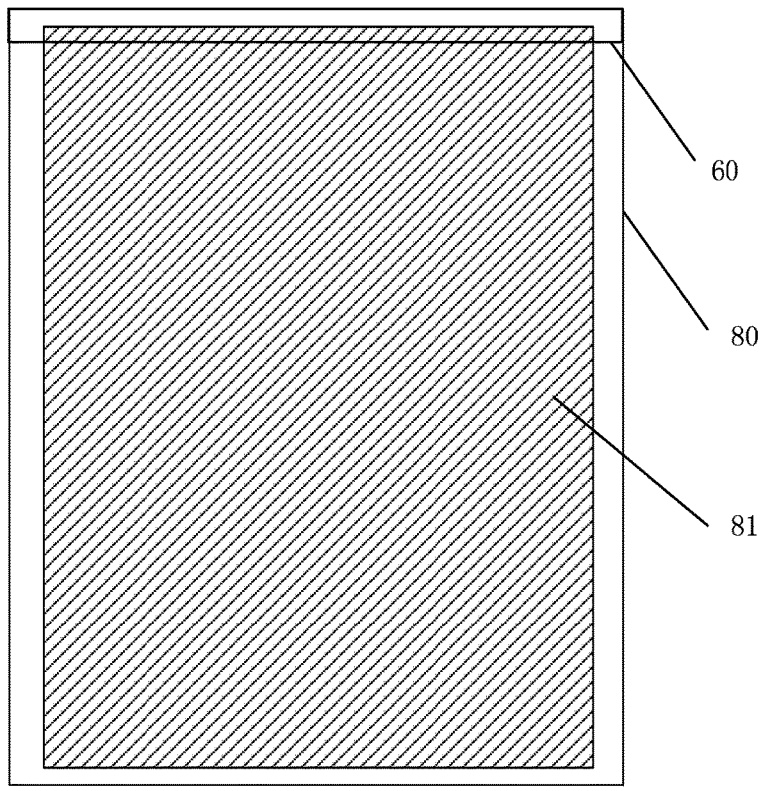
FIG. 7 is a schematic diagram showing an edge design of an opposite substrate according to an embodiment of the present disclosure.

For example, the display panel further includes an opposite substrate cell-assembled with the array substrate. For example, the cell-assemble structure of the array substrate and the opposite substrate can be referred to FIGS. 4, 5 and 8. FIG. 6 and FIG. 7 are schematic planar structural diagrams of the opposite substrate according to the embodiment of the present disclosure. Various structural features of the array substrate itself are applicable to the display panel including the array substrate, and the repetitive part will not be described again.

The opposite substrate includes a base substrate 80 and an opposite substrate common electrode 81 on the base substrate 80. For example, the opposite substrate includes a second communication region 60 at the DPO side of the opposite substrate. The opposite substrate common electrode is at least partially located in the second communication region 60, so that it can be electrically connected to the first common electrode line in the first communication region 40 of the array substrate. In the embodiment shown in FIG. 6, the edges of the base substrate 80 and the common electrode 81 are aligned with each other, so that the base substrate 80 and the common electrode 81 are shown by using a same rectangular frame.

For example, referring to the cross-sectional views shown in FIG. 4 and FIG. 5, the opposite substrate common electrode 81 in the second communication region 60 and the first common electrode line 401 in the first communication region 40 can be electrically connected by a sealant containing conductive substances. For example, Au balls can be doped into the sealant to make the sealant conductive. The Au ball can be formed by coating with a nickel (Ni) and gold (Au) layer at an outer side of a plastic core, using the sealant doped with the Au balls can take the place of a traditional conductive silver glue process, thereby reducing the process steps and improving the production efficiency while connecting the opposite substrate common electrode with the common electrode of the array substrate.

For example, the sealant for conducting electricity can be filled between the DPO side of the array substrate and the DPO side of the opposite substrate, so as to electrically connect the opposite substrate common electrode 601 in the second communication region 60 with the first common electrode line 401 in the first communication region 40.

As another implementation of the embodiment of the present disclosure, in the second communication region 60, an outer edge of the opposite substrate common electrode 601 and an outer edge of the opposite substrate are spaced apart from each other. That is, the outer edge of the opposite substrate common electrode is located at an inner side of the outer edge of the opposite substrate with a space therebetween.

FIG. 7 is a plan view of an opposite substrate according to an embodiment of the present disclosure. As shown in FIG. 7, the outer edge of the opposite substrate common electrode 81 and the outer edge of the opposite substrate are spaced apart from each other, that is, the outer edge of the opposite substrate common electrode 81 and the outer edge of the opposite substrate are designed to be non-aligned. For example, the non-aligned edge design means that the outer edge of the opposite substrate common electrode 81 does not coincide with the outer edge of the opposite substrate, and the outer edge of the opposite substrate common electrode 81 is disposed within the outer edge of the opposite substrate. By using the non-aligned edge design, and an insulating sealant can be filled in the non-aligned region. After being cell-assembled, a margin region of the opposite substrate common electrode of the opposite substrate is completely covered by the sealant, and the insulating sealant filled in the non-aligned region can block the external static electricity from directly contacting the opposite substrate common electrode. In addition, it should be noted that the sealant itself is an insulating material, and the Au balls are doped to realize electrical connection only when the sealant needs to connect the conductive components on both sides thereof. Therefore, in the communication regions, only a part of the sealant in contact with the opposite substrate common electrode are doped with the Au balls to realize electrical conduction, while other part of the sealant can maintain the insulating characteristics thereof. For example, in the non-aligned edge design shown in FIG. 7, a part of the sealant located at an outer side of the outer edge of the opposite substrate common electrode can be kept insulated, thereby prevent the interference of external electrostatic. Therefore, the retraction setting of the opposite substrate common electrode can enhance the antistatic releasing ability on one hand, and does not affect the performance of the sealant on the other hand. It can be understood that the non-aligned design can be applied not only to the TN type narrow-frame display device, but also to all TN type display devices.

For example, a distance between the outer edge of the opposite substrate common electrode and the outer edge of the opposite substrate can be set by those skilled in the art according to an actual application scenario, and the non-aligned edge can be a straight line or a curve, which is not specifically limited in the embodiment of the present disclosure.

In the non-aligned edge design of FIG. 7, there is a void between the outer edge of the opposite substrate common electrode 81 and the outer edge of the opposite substrate. In an implementation of the embodiment of the present disclosure, the void is filled with the insulating sealant.

Figure 8:
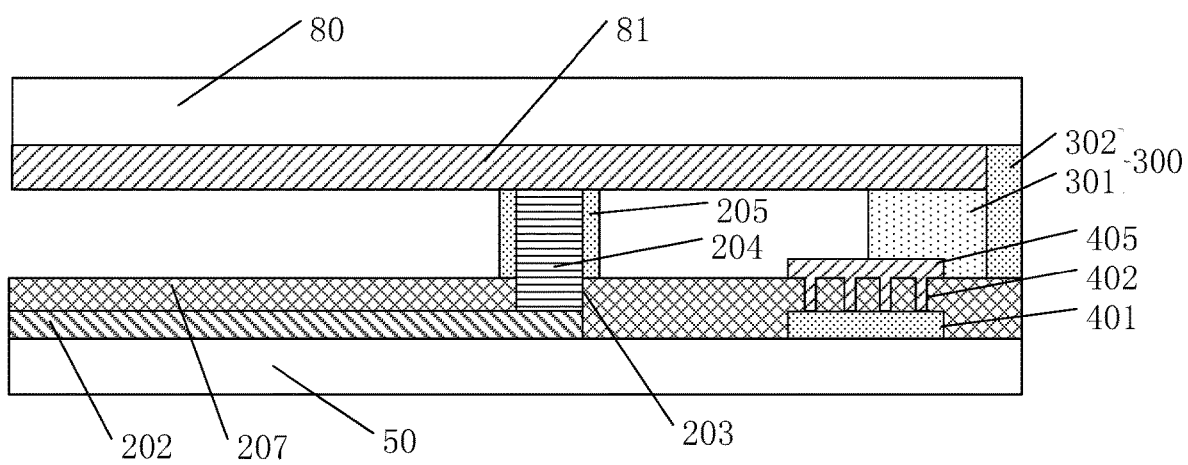
FIG. 8 is a cross-sectional view of an opposite substrate according to an embodiment of the present disclosure.

FIG. 8 shows a schematic cross-sectional view of a non-aligned edge design. For example, the cut position of FIG. 8 corresponds to the cut position of FIG. 4, and the only difference is that FIG. 8 is a non-aligned edge design. As shown in FIG. 8, the outer edge of the opposite substrate common electrode is disposed at an inner side of the outer edge of the opposite substrate. For example, the non-aligned region (i.e., the region not overlapping with the opposite substrate common electrode in a direction perpendicular to the opposite substrate) is filled with an insulating sealant 302, so that the external static electricity can be blocked by the insulating sealant, and will not directly contact the opposite substrate common electrode. Therefore, the retraction setting of the opposite substrate common electrode can enhance the antistatic releasing ability on one hand, and does not affect the performance of the sealant on the other hand. In addition, it should be noted that the inner portion 301 of the sealant (i.e., the portion overlapping the opposite substrate common electrode in a direction perpendicular to the opposite substrate) in FIG. 8 can be a conductive sealant (for example, a sealant doped with Au balls), thereby realizing an electrical connection of the opposite substrate common electrode and the common electrode line on the array substrate. In the manufacturing process of the display panel, for example, the conductive sealant 301 and the insulating sealant 302 can be separately manufactured.

In the above description with respect to the array substrate and the opposite substrate, the structure of the display panel formed by cell-assembling of the array substrate and the opposite substrate is also described. Therefore, the structure of the display panel according to the embodiment of the present disclosure can also be referred to the cross-sectional views shown in FIGS. 4, 5, and 8 and related description thereof, and the planar views respectively shown with respect to the array substrate and the opposite substrate and related description thereof, and details will not be described here again.

In addition, it should be noted that, in the above description with respect to the array substrate, the opposite substrate and the display panel, only the relevant layers or accessories are described, and other layers or components are not precluded according to the embodiments of the present disclosure. For example, on the array substrate and the opposite substrate, an alignment film formed of polyimide, a color filter, a pixel electrode, a data line, a black matrix, an ultraviolet mask layer, and so on, can be disposed, and the arrangement positions thereof can be referred to the related art, and details will not be described here again.

In addition, the embodiment of the present disclosure further provides a display device, including any one display panel described above. Specifically, the display device can be an electronic product such as a mobile phone, a computer, a wristband, or a television, etc. The display device is not specifically limited in the embodiment of the present disclosure.

In summary, in the embodiment of the present disclosure, the first common electrode line located in the first communication region of the array substrate is connected to the driving element of the driving bonding region through the second common electrode line, one end of the third common electrode line in the gate driving circuit region is connected to the driving element, and the other end of the third common electrode line is close to the first communication region and insulated from the first common electrode line. Because the second end of the third common electrode line in the gate driving circuit region is insulated from the first common electrode line in the first communication region, that is, the common electrode line entering the gate driving circuit region from the first communication region in the array substrate is cut, so that static electricity does not directly flow to the gate driving circuit region in a large amount, the phenomenon of breakdown of the via hole in the gate driving circuit region due to the electrostatic releasing is avoided, and the antistatic releasing property of the array substrate is improved. Although the common electrode line entering the gate driving circuit region from the first communication region in the array substrate is cut, the first communication region can still communicate with the third common electrode line via the driving bonding region, so the embodiment of the present disclosure do not damage the basic performance of the array substrate on the basis of improving the antistatic releasing property of the array substrate.

For example, the embodiment of the present disclosure further provides a driving method of the above array substrate or display panel, and the method includes: loading a common electrode signal of for a preset duration to the third common electrode line before outputting a display driving signal; driving the array substrate to display upon a startup time of the array substrate reaching the preset duration. The driving method can avoid the occurrence of the delay phenomenon when the common electrode signal is transmitted to the end of the third common electrode line close to the first communication region, so that the array substrate of the embodiment of the present disclosure can be applied to a display device having a large area.

For example, the display panel according to the embodiments of the disclosure can be a liquid crystal display panel, e.g., a twisted nematic type thin film transistor liquid crystal display panel.

It should be noted that the embodiments in the specification are described in a progressive manner, and each embodiment focuses on differences from other embodiments, and the same or similar parts among the embodiments can be referred to each other.

Finally, it should also be noted that in this context, relational terms such as first and second, etc., are used merely to distinguish one entity or operation from another entity or operation, and do not necessarily require or imply that there is any such actual relationship or order between these entities or operations. Furthermore, the terms "comprise," or "include," or any other variations are intended to encompass a non-exclusive inclusion, such that a process, method, item, or element that includes a series of elements includes not only those elements, but also other elements that are not explicitly listed, or elements that are inherent to such a process, method, item, or device. Without further limitation, an element defined by the phrase "comprising a . . . " does not preclude the existence of additional identical elements in the process, method, item, or device that includes the element.

What have been described above are only specific implementations of the present disclosure, and are not intended to limit the protection scope of the present disclosure. The protection scope of the present disclosure should be based on the protection scope of the claims.

What is claimed is:

1. An array substrate, comprising a base substrate, the base substrate comprising a display region and a peripheral region surrounding the display region, the peripheral region comprising a gate driving circuit region, a driving bonding region and a first communication region, the driving bonding region and the first communication region are respectively disposed on both sides of the display region in a first direction parallel to the base substrate, the gate driving circuit region is disposed on at least one side of the display region in a second direction parallel to the base substrate, the first direction and the second direction intersecting with each other;

a first common electrode line, located in the first communication region;

a second common electrode line, located on a side of the gate driving circuit region away from the display region; and a third common electrode line, located in the gate driving circuit region, wherein the second common electrode line is electrically connected to the first common electrode line, and is electrically connected to a driving element in the driving bonding region;

the third common electrode line includes a first end close to the driving bonding region and a second end close to the first communication region, the first end of the third common electrode line is connected to the driving element, the second end of the third common electrode line is insulated from the first common electrode line.

2. The array substrate according to claim 1, wherein the second end of the third common electrode line and the first common electrode line are spaced apart from each other.

3. The array substrate according to claim 1, wherein the first communication region is configured to electrically connect the first common electrode line with an external device.

4. The array substrate according to claim 1, wherein the driving element is configured to load a common electrode signal for a preset duration to the third common electrode line before outputting a display driving signal;

the driving element is further configured to drive the array substrate to display upon a startup time of the array substrate reaching the preset duration.

5. The array substrate according to claim 1, wherein an insulating layer is located on a side of the third common electrode line away from the base substrate, and a first via hole communicated with the third common electrode line is located in the insulating layer;

wherein a distance from an orthographic projection of the first via hole on the third common electrode line to the first end of the third common electrode line is greater than a distance from the orthographic projection of the first via hole on the third common electrode line to the second end of the third common electrode line.

6. The array substrate according to claim 5, wherein the orthographic projection of the first via hole on the third common electrode line at least partially overlaps with the second end of the third common electrode line.

7. The array substrate according to claim 6, wherein a conductive member is located in the first via hole, and the conductive member is configured to electrically connect the third common electrode line with an external device.

8. The array substrate according to claim 5, wherein the insulating layer is further located on a side of the first common electrode line away from the base substrate, and the insulating layer has a thickness of no less than 4000 Å.

9. The array substrate according to claim 1, wherein a width of the third common electrode line is greater than a width of the second common electrode line.

10. The array substrate according to claim 1, wherein the second common electrode line and the third common electrode line extend in the first direction, and the first common electrode line extends in the second direction.

11. A display panel, comprising the array substrate according to claim 1.

12. The display panel according to claim 11, further comprising: an opposite substrate cell-assembled with the array substrate, wherein the opposite substrate comprises a second communication region, an orthographic projection of the second communication region on the base substrate of the array substrate at least partially overlaps with an orthographic projection of the first communication region on the base substrate of the array substrate;

the opposite substrate further comprises an opposite substrate common electrode, and a portion of the opposite substrate common electrode is located in the second communication region, and is electrically connected to the first common electrode line of the first communication region.

13. The display panel according to claim 12, wherein a first insulating layer is located on a side of the third common electrode line away from the base substrate, and a first via hole communicated with the third common electrode line is located in the first insulating layer;

an orthographic projection of the first via hole on the third common electrode line at least partially overlaps with the second end of the third common electrode line, or a distance from the orthographic projection of the first via hole on the third common electrode line to the first end of the third common electrode line is greater than a distance from the orthographic projection of the first via hole on the third common electrode line to the second end of the third common electrode line;

a conductive member electrically connected to the opposite substrate common electrode is located between the opposite substrate common electrode and the array substrate, and the conductive member is electrically connected to the third common electrode through the first via hole.

14. The display panel according to claim 13, wherein an outer side of the conductive member is wrapped with a second insulating layer.

15. The display panel according to claim 13, wherein a conductive sealant is located between the first communication region of the array substrate and the second communication region of the opposite substrate, and the sealant is configured to electrically connect the first common electrode line with the opposite substrate common electrode.

16. The display panel according to claim 15, wherein the first insulating layer is further located on a side of the first common electrode line away from the base substrate, a plurality of second via holes communicated with the first common electrode line are located in the first insulating layer, a connecting electrode is located on a side of the first insulating layer away from the base substrate;

wherein an area of an orthographic projection of a region where the connecting electrode directly contacts the sealant on the base substrate is a first area, and an area of an orthographic projection of the connecting electrode on the base substrate is a second area, a ratio of the first area to the second area is greater than 30%.

17. The display panel according to claim 16, wherein the first insulating layer has a thickness of no less than 4000 Å.

18. The display panel according to claim 16, wherein an outer edge of the opposite substrate common electrode is located at an inner side of an outer edge of the opposite substrate, and is separated from the outer edge of the opposite substrate.

19. The display panel according to claim 18, wherein an insulating sealant is located between the array substrate and the opposite substrate and in a region between the outer edge of the opposite substrate common electrode and the outer edge of the opposite substrate, the insulating sealant is disposed at an outer side of the conductive sealant.

20. A display device, comprising the display panel according to claim 11.

* * * * *